(12) United States Patent
Wang et al.

(10) Patent No.: US 11,558,978 B2
(45) Date of Patent: Jan. 17, 2023

(54) FAN SYSTEM AND SOUND SUPPRESSION METHOD THEREOF

(71) Applicant: WISTRON CORP., New Taipei (TW)

(72) Inventors: Cheng-Pang Wang, New Taipei (TW);
Chih-Chun Liu, New Taipei (TW);
Hung Jen Su, New Taipei (TW);
Wen-Chen Wu, New Taipei (TW)

(73) Assignee: WISTRON CORP., New Taipei (TW)

( * ) Notice: Subject to any disclaimer, the term of this patent is extended or adjusted under 35 U.S.C. 154(b) by 183 days.

(21) Appl. No.: 17/106,219

(22) Filed: Nov. 30, 2020

(65) Prior Publication Data

US 2021/0100133 A1    Apr. 1, 2021

Related U.S. Application Data

(62) Division of application No. 16/191,683, filed on Nov. 15, 2018, now abandoned.

(30) Foreign Application Priority Data

Aug. 1, 2018 (TW) .................... 107126742

(51) Int. Cl.
*H05K 7/20* (2006.01)
*G06F 1/20* (2006.01)
*F04D 29/66* (2006.01)

(52) U.S. Cl.
CPC ..... *H05K 7/20172* (2013.01); *H05K 7/20209* (2013.01); *F04D 29/663* (2013.01); *G06F 1/20* (2013.01)

(58) Field of Classification Search
CPC .... F04D 29/663; F04D 29/664; F04D 29/665; F04D 29/667
See application file for complete search history.

(56) References Cited

U.S. PATENT DOCUMENTS 7,658,592 B1    2/2010    Jarrah et al.
2003/0097839 A1    5/2003    Tazawa et al.
(Continued)

FOREIGN PATENT DOCUMENTS

| JP | H01161194 | * | 6/1989 |
| JP | H01161194 A | | 6/1989 |
| JP | 1169194 | | 7/1989 |

OTHER PUBLICATIONS

China Patent Office, "Office Action", dated Jul. 27, 2020, China.
(Continued)

*Primary Examiner* — Henry T Crenshaw
(74) *Attorney, Agent, or Firm* — McClure, Qualey & Rodack, LLP

(57) ABSTRACT

A fan system is used for dissipating heat of an electronic device. The fan system includes a fan, a hollow structure, and a control circuit. Sound waves made by the fan are transmitted to an interior of the hollow structure when the fan is operating. The control circuit is connected to the hollow structure and is configured to control deformation/deformations of the hollow structure according to a state/states of the fan and/or the electronic device, which change a volume of the interior of the hollow structure for making a resonance frequency of the hollow structure being approximate to a rotation speed of the fan or being the same as the rotation speed of the fan.

5 Claims, 9 Drawing Sheets

(56) References Cited

U.S. PATENT DOCUMENTS

| | | | | |
|---|---|---|---|---|
| 2010/0193283 A1* | 8/2010 | Vaz | .................... | F02M 35/1261 |
| | | | | 181/229 |
| 2012/0181107 A1* | 7/2012 | Hwang | .............. | F02M 35/1266 |
| | | | | 181/229 |
| 2015/0226098 A1* | 8/2015 | Schnitta | .................... | B32B 7/12 |
| | | | | 181/238 |
| 2016/0010558 A1* | 1/2016 | Hussain | .................. | F02C 7/042 |
| | | | | 137/15.1 |
| 2017/0060203 A1* | 3/2017 | Hagiwara | ................ | H04N 1/00 |
| 2017/0074290 A1* | 3/2017 | Ponyavin | .............. | F04D 29/522 |
| 2017/0292795 A1* | 10/2017 | Waissi | .................... | F28F 3/046 |
| 2018/0132382 A1* | 5/2018 | Baran | ................ | H05K 7/20918 |
| 2019/0301322 A1* | 10/2019 | Strombeck | ............ | F02B 63/044 |
| 2019/0313548 A1* | 10/2019 | Chonan | .................. | G06F 1/206 |

OTHER PUBLICATIONS

Taiwan Patent Office, "Office Action", dated Apr. 2, 2019, Taiwan.
Bojian Lu et al., The Control and prevention of noise, Chapter 8: The principle of sound absorption and the application, D p. 306-p. 334, 2011.
Long-Jyi Yeh et al., A Study on the Mechanical Property of Shape Memory Alloy, The 23rd conference of Chinese D Society of Mechanical Engineers, 2006.

* cited by examiner

FAN SYSTEM AND SOUND SUPPRESSION METHOD THEREOF

CROSS-REFERENCE TO RELATED APPLICATIONS

This non-provisional application claims priority under 35 U.S.C. § 119(a) on Patent Application No(s). 107126742 filed in Taiwan, R.O.C. on Aug. 1, 2018, the entire contents of which are hereby incorporated by reference.

TECHNICAL FIELD

The disclosure relates to a fan system and sound suppression method thereof, more particularly to a fan system and a method for suppressing the noise with different frequency.

BACKGROUND

Conventionally, the fan is often disposed behind the hardware device for the rack mount disposition of the server with high memory capacitance, but the spacing between the fan and the hardware device is decreased as the requirement in spacing usage becomes more and more strict. The read performance and write performance of the hardware device may be effected by the noise frequency generated by the fan in operation. However, the rotation speed of the fan is changed based on the inside temperature of the server, and there will be various noise frequencies due to the different rotation speeds. As a result, it's difficult to suppress the noise generated by the fan.

For these reasons, it presently needs a preferable fan system to improve the above problems.

SUMMARY

A fan system is disclosed in an embodiment based on this disclosure, wherein the fan system is for cooling an electronic device, and the fan system comprises: a fan and a hollow structure, wherein the hollow structure in the shape of a neck container, and a sound wave is transmitted to the hollow structure when the fan is operating. There is at least one control circuit connected to the hollow structure, and the at least one control circuit connected to the hollow structure and configured to control a deformation degree of the hollow structure based on an operation state of at least one of the fan and the electronic device. Hence, the volume of the hollow structure may be changed for making the resonance frequency of the hollow structure approximate or even equal to a rotation frequency of the fan.

A fan system is disclosed in an embodiment based on this disclosure, wherein the fan system is for cooling an electronic device, and the fan system comprises: a fan; a body surrounding the fan, wherein an interior face of the body faces the fan and the interior face is spaced from the fan. In addition, the interior face comprises a groove, and the fan transmits a sound wave to the groove. Also, there is a control circuit connected to the body, and the control circuit controls the deformation of the body based on the operation state from at least one of the fan and the electronic device for changing the volume of the groove.

A fan system is disclosed in an embodiment based on this disclosure, wherein the fan system is applied to dissipate the heat from an electronic device, and the fan system comprises: a fan; a body surrounding the fan, and the body comprises an interior face and a side face is next to the interior face, wherein the interior face faces the fan and the interior face is spaced from the fan. Additionally, the side face comprises a groove, and a sound wave is transmitted to the groove when the fan is operating. Moreover, there's a control circuit connected to the body, wherein the control circuit controls the deformation of the body based on the operation state from at least one of the fan and the electronic device for changing the volume of the groove.

A sound suppression method for the fan system is disclosed in an embodiment based on this disclosure, wherein the fan system comprises a fan and a hollow structure, and the sound suppression method comprises: transmitting a sound wave to an interior of the hollow structure by the operating of the fan, detecting the operation state from at least one of the fan and an electronic device, controlling the deformation of the hollow structure to change the volume of the interior of the hollow structure based on the operation state from at least one of the fan and an electronic device, and finally making the resonance frequency of the hollow structure approximate to or even equal to a rotation frequency of the fan.

BRIEF DESCRIPTION OF THE DRAWINGS

The present disclosure will become more fully understood from the detailed description given herein below and the accompanying drawings which are given by way of illustration only and thus are not limitative of the present disclosure and wherein.

DETAILED DESCRIPTION

Figure 1:
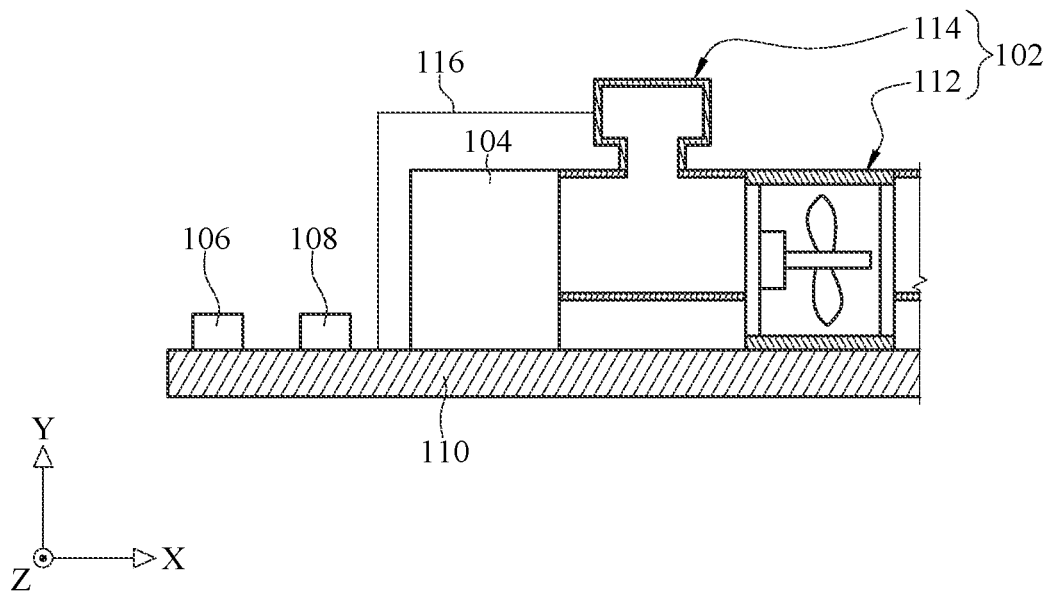
FIG. 1 is the schematic diagram of the fan system disposed in the server in an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1. FIG. 1 is the schematic diagram of the fan system disposed in the server in an embodiment. As FIG. 1 shows, a server 100 comprises a fan system 102, a hardware device 104, a central processor unit 106, a temperature sensor 108 and a circuit board 110. The fan system 102 comprises a fan 112 and a sound suppressing device 114, and the sound suppressing device 114 is connected between the fan 112 and the hardware device 104. The fan 112, the hardware device 104 and the temperature sensor 108 are electrically connected to the circuit board 110, wherein the temperature sensor 108 detects the inside temperature of the server 100, and the sound suppressing device 114 is electrically connected to the circuit board 110 by an external wire 116.

Furthermore, there is no limitation for the quantity of the sound suppressing device. For an example of two sound suppressing devices, one of the sound suppressing devices may be disposed between the fan and the hardware device, and another one of them may be disposed between the fan and other electronic devices in the server.

Figure 2:
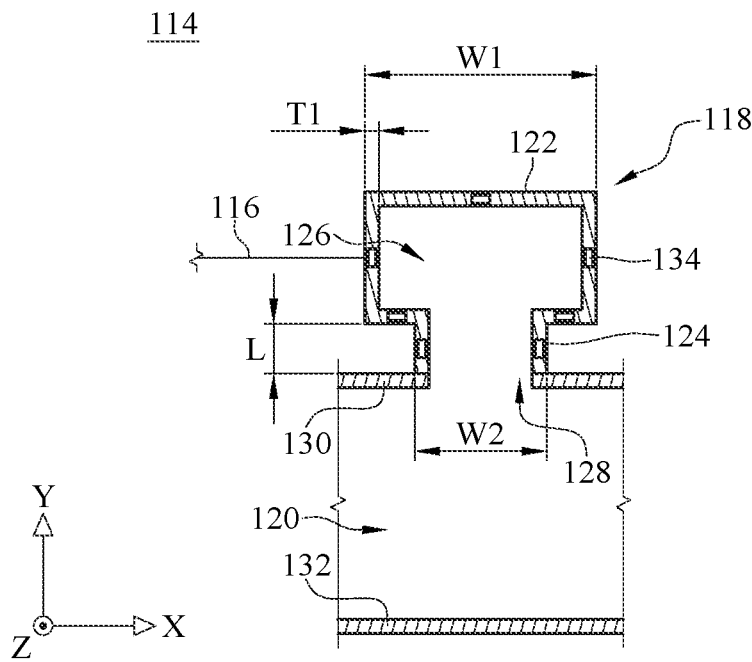
FIG. 2 is the schematic diagram of the fan system based on FIG. 1 in the first embodiment.

Please refer to FIG. 1 and FIG. 2. FIG. 2 is the schematic diagram of the fan system based on FIG. 1 in the first embodiment. As FIG. 1 and FIG. 2 show, the sound suppressing device 114 comprises a hollow structure 118 and a channel 120 communicated with the hollow structure 118. In addition, the hollow structure 118 is an integrally formed shell in the shape of a neck container, and the hollow structure 118 comprises a body 122 and a neck 124. Also, the body 122 and the neck 124 comprise a thickness T1, wherein the bottom of the body 122 is connected to the top of the neck 124 for surrounding and forming an interior 126 of the hollow structure 118. In this embodiment, the hollow structure 118 is a resonator, the bottom of the neck 124 includes an opening 128, and the channel 120 is formed by a top wall 130 and a bottom wall 132. Moreover, the top wall 130 is connected around the opening 128 of the neck 124, the two ends of the channel 120 are respectively extended to the fan 112 and the hardware device 104, and the channel 120 is communicated with the interior 126 through the opening 128 of the neck 124. The body 122 has a width W1 and the neck 124 has a width W2 both in the x-axis direction, and the width W2 of the neck is smaller than the width W1 of the body 122. There's no limitation for the shapes of the body 122 and the neck 124. For example, the shape may be a rectangle or a cylinder, but it must meet the criteria, "the width W2 smaller than the width W1". As a result, the hollow structure 118 in this embodiment is able to be replaced by any other kinds of hollow structures.

Generally, when the shape of a normal metal or alloy is changed by an external force which is out of the elastic range, its shape isn't able to be restored by releasing the external force or heating. In this embodiment, the material of the body 122 and the neck 124 is shape memory alloy, wherein the shape memory alloy is a kind of alloy memorizing the original shape according to the changing phase. When the shape memory alloy in the low temperature phase (martensite phase) is deformed by an external force that is limited but larger than the elastic range thereof, the shape is able to be restored by being heated over the critical temperature for transforming to the structure in the high temperature phase (austenite phase). For example, the shape memory alloy may be the alloy of TiNi series, Cu series or Fe series.

The fan system 102 further comprises a plurality of control circuits 134, the control circuits 134 are respectively embed in the body 122 and the neck 124, and each of the control circuits 134 is electrically connected to the circuit board 110 by the wire 116 for obtaining the rotation speed information of the fan 112 and the temperature information detected by the temperature sensor 108 in the server 100. Moreover, each of the control circuits 134 determines whether to heat the body 122 and/or the neck 124 based on the above information. In other embodiment, the control circuit 134 is embed in the body 122 or the neck 124.

Figure 3:
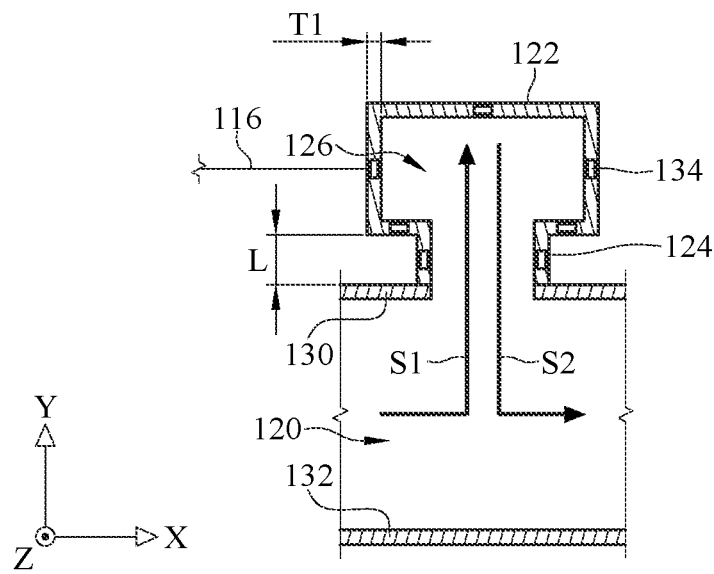
FIG. 3 is the schematic diagram of the hollow structure based on FIG. 2 for decreasing the noise of the fan.

Please refer to FIG. 3, wherein FIG. 3 is the schematic diagram of the hollow structure based on FIG. 2 for decreasing the noise of the fan 112. As FIG. 3 shows, the inward sound wave S1 enters the interior 126 of the hollow structure 118, and the outward sound wave S2 enters the channel 120 after the outward sound wave S2 leaves the interior 126. Based on the Helmholtz resonance formula, the resonance frequency of the hollow structure 118 is shown as the following formula (1):

$$f = c/2\pi \sqrt{(A/LV)} \tag{1}$$

In the above formula (1), "f" is the resonance frequency of the hollow structure 118, "c" is the speed of sound, "A" is the cross area of the neck 124, "L" is the length of the neck 124, and "V" is the volume of the interior 126. In other word, the resonance frequency f is relative to the cross area of the neck 124, the length L of the neck 124 and the volume of the interior 126.

The absorption coefficient ($\propto$) of the hollow structure 118 is relative to the absorption ability of the hollow structure 118, and the absorption coefficient ($\propto$) is shown as the following formula (2):

$$\propto = \frac{E_i - E_r}{E_i}. \tag{2}$$

In the above formula (2), "$E_i$" is the energy of the inward sound wave S1, and "$E_r$" is the energy of the outward sound wave S2. Therefore, "$E_i - E_r$" is the sound energy absorbed by the hollow structure 118, while the absorption coefficient ($\propto$) is between 0 to 1. The more the absorption coefficient ($\propto$) approximates to 1, the better the absorption ability of the hollow structure 118 is. Additionally, the absorption coefficient ($\propto$) approximates to 1 when the resonance frequency of the hollow structure 118 approximates to the frequency of the inward sound wave S1 generated by the operating fan 112, and the sound volume is decreased obviously after the phase cancellation against the inward sound wave S1 entering the interior 126.

Figure 4:
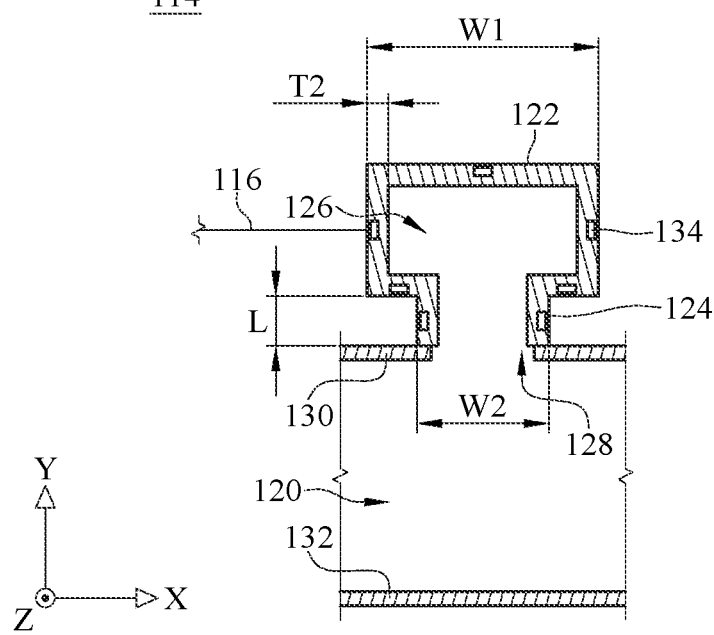
FIG. 4 is the volume changed in the interior of the hollow structure based on FIG. 2.

Please refer to FIG. 1 and FIG. 4, wherein FIG. 4 is the schematic diagram of the volume changed in the interior of the hollow structure. As FIG. 1 and FIG. 4 show, based on the Helmholtz resonance formula, the resonance frequency is changed as one of the cross area of the neck 124, the length L of the neck 124 and the volume of the interior 126 is changed. Hence, through heating the hollow structure 118 by the control circuit 134 to increase the thickness of the shape memory alloy from T1 to T2, the volume of the interior 126 is decreased. In short, based on the Helmholtz resonance formula, the resonance frequency is increased when the volume of the interior 126 is decreased. In contrast, the resonance frequency is decreased when the volume of the interior 126 is increased.

Figure 5:
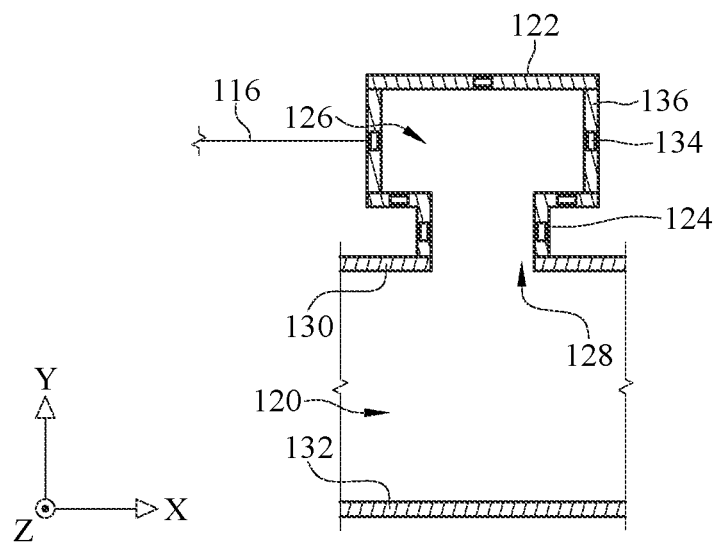
FIG. 5 is the schematic diagram of the fan system based on FIG. 1 in the second embodiment.

Please refer to FIG. 5. FIG. 5 is the schematic diagram of the fan system based on FIG. 1 in the second embodiment. As FIG. 5 shows, the interior 126 of the sound suppressing device 114 comprises a plurality of shape memory alloy planes 136 connected to each other instead of an integrally formed structure, and the control circuit 134 is embedded in the shape memory alloy planes 136 and the neck 124.

Figure 6:
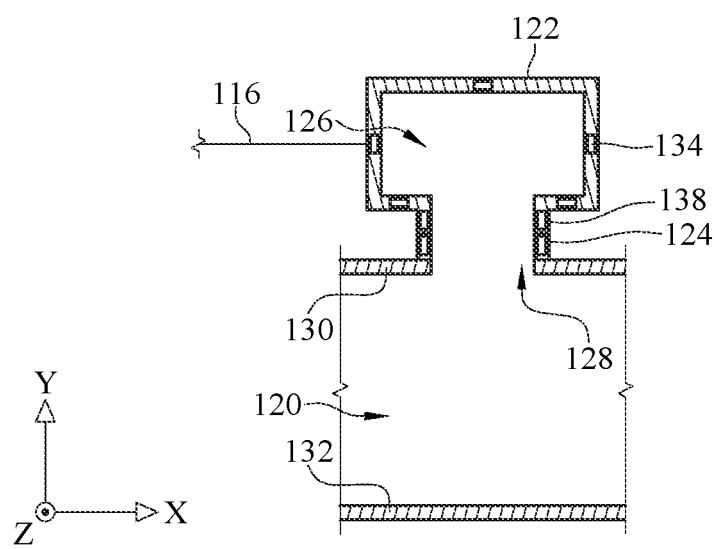
FIG. 6 is the schematic diagram of the fan system based on FIG. 1 in the third embodiment.

Please refer to FIG. 6, wherein FIG. 6 is the schematic diagram of the fan system based on FIG. 1 in the third embodiment. As FIG. 6 shows, the neck 124 of the hollow structure 118 from the sound suppressing device 114 comprises a plurality of shape memory alloy planes 136 connected to each other instead of an integrally formed structure, and the control circuit 134 is embedded in the shape memory alloy planes 136 and the neck 124.

Figure 7:
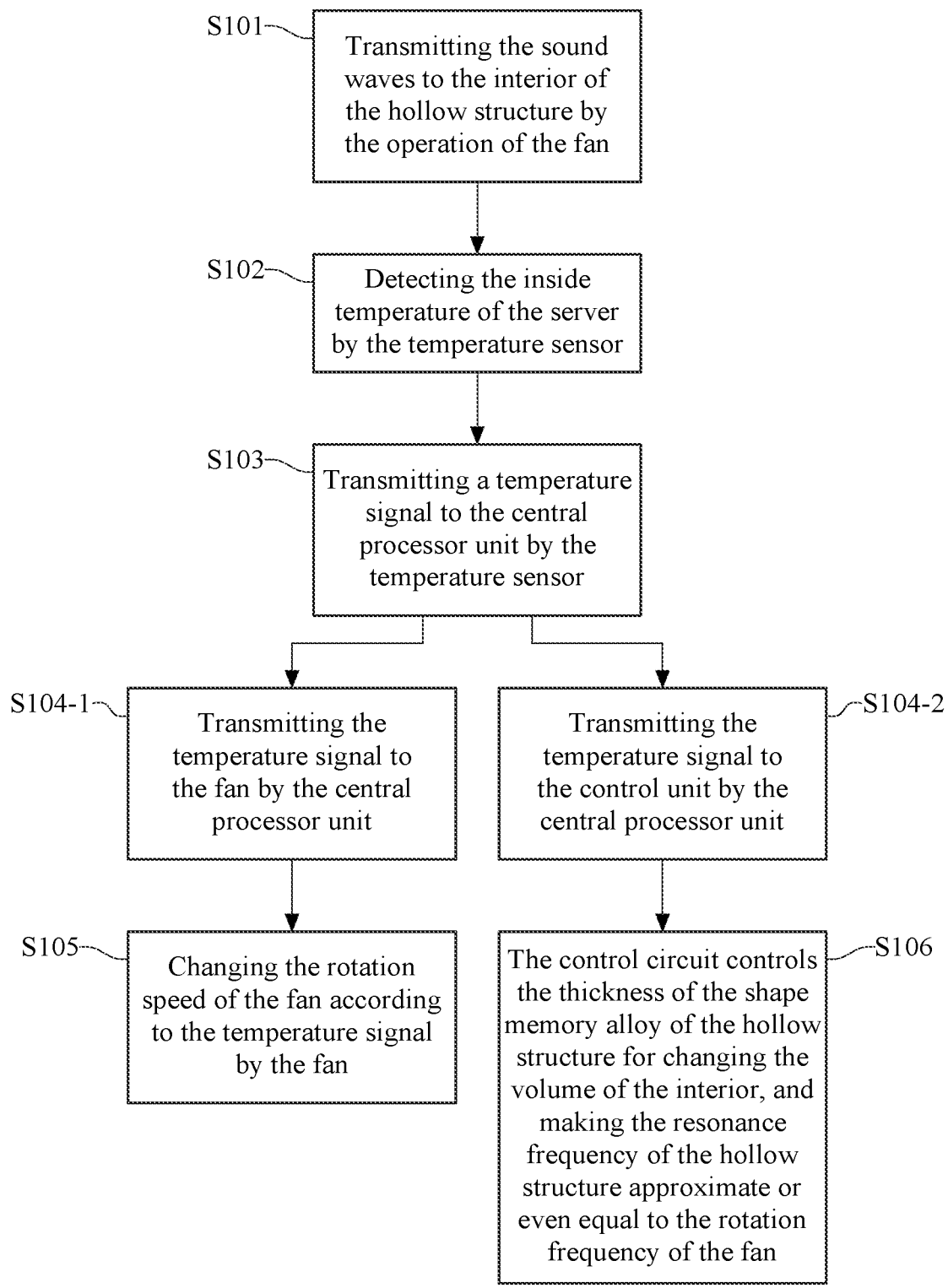
FIG. 7 is the flowchart of the sound suppression method.

Please refer to FIG. 1 and FIG. 7 together, wherein FIG. 7 is the flowchart of the sound suppression method for the fan system based on FIG. 1. As FIG. 1 and FIG. 7 show, the step S101 is transmitting the sound waves to the interior 126 by the operation of the fan 112. The step of S102 is detecting the inside temperature of the server by the temperature sensor 108. The step S103 is transmitting a temperature signal to the central processor unit 106 by the temperature sensor 108. The step S104-1 is transmitting the temperature signal to the fan 112 by the central processor unit 106, and the step S104-2 is transmitting the temperature signal to the control circuit 134 by the central processor unit 106. The step S105 is changing the rotation speed of the fan 112 according to the temperature signal. For the step S106, the control circuit 134 controls the thickness of the shape memory alloy of the hollow structure 118 for changing the volume of the interior 126, and making the resonance frequency of the hollow structure 118 approximate to or even equal to the rotation frequency of the fan 112.

The rotation speed of the fan 112 is changed as the inside temperature of the server 100 is changed, and the fan 112 includes the rotation frequency corresponded to the rotation speed. The fan 112 generates the sound wave signals with low frequency when the fan 112 operates in the low rotation speed, and the fan 112 generates sound wave signals with high frequency when the fan 112 operates in the high rotation speed. As FIG. 7 shows, the control circuit 134 increases the thickness of the shape memory alloy by heating the shape memory alloy of the hollow structure 118 when the rotation speed of the fan 112 is gained. Hence, the volume of the interior 126 is decreased, and the resonance frequency of the hollow structure 118 is increased through this process. If the rotation speed of the fan 112 is decreased as the fan 112 operates for a time period, the control circuit 134 heats the shape memory alloy of the hollow structure 118 and makes the temperature of the shape memory alloy be more than its critical temperature. As a result, the shape memory alloy is transformed to the structure of the high temperature phase (austenite phase), and making both of the volume of the interior 126 and the resonance frequency of the hollow structure 118 return to the original states.

Figure 8:
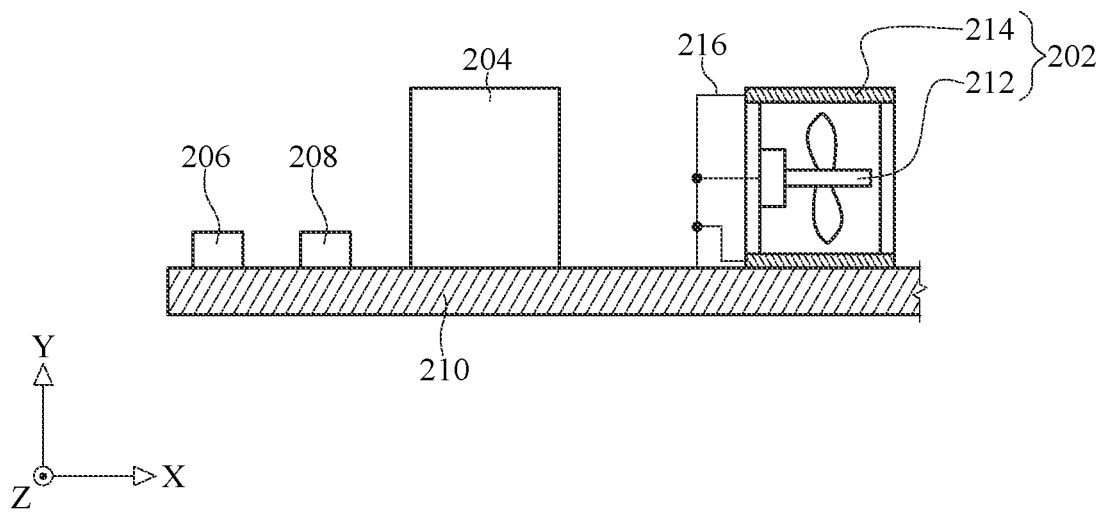
FIG. 8 is the schematic diagram of the fan system disposed in the server in another embodiment for this disclosure.

The hollow structure in this disclosure is able to be replaced by other structures for implementation of the sound suppression method. Please refer to FIG. 8. FIG. 8 is the schematic diagram of the fan system disposed in the server in another embodiment for this disclosure. As FIG. 8 shows, a server 200 comprises a fan system 202, a hardware device 204, a central processor unit 206, a temperature sensor 208 and a circuit board 210. The fan system 202 comprises a fan 212 and a body 214, wherein the body 214 surrounds the fan, and the fan system 202 is disposed at a side of the hardware device 204. The fan 212, the hardware device 204, the central processor unit 206, and the temperature sensor 208 are electrically connected to the circuit board 210. Also, the body 214 is electrically connected to the circuit board 210 by an external wire 216, and the temperature sensor 208 detects the inside temperature of the server 200.

Figure 9A:
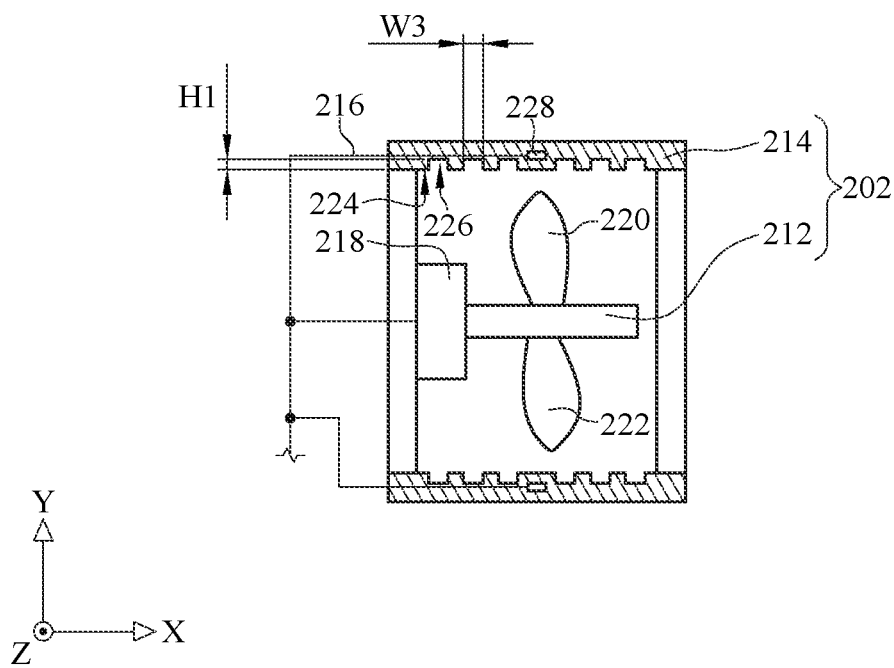
FIG. 9A is the schematic diagram of the fan system based on FIG. 8 in the first embodiment.

Please refer to FIG. 8 and FIG. 9A together, wherein FIG. 8 and FIG. 9A are the schematic diagrams of the fan system in the first embodiment. As FIG. 8 and FIG. 9A show, the body 214 of the fan system 202 is a frame made by the shape memory alloy, wherein the body 214 surrounds the fan 212 and the body 214 is spaced from the fan 212 in the y-axis direction. The fan 212 comprises a motor 218 and two blades 220 and 222, and the two blades 220 and 222 are respectively connected to the two sides of the motor 218. The body 214 comprises an interior face 224, and the interior face 224 is spaced from the two blades 220 and 222. A plurality of grooves 226 are disposed in the interior face 224, and the grooves 226 are separated by a plurality of intervals. Also, each of the grooves 226 has a width W3 in the x-axis direction and a depth H1 in the y-axis direction. When the motor 218 turns the two blades 220 and 222, the airflow is driven by the two blades 220 and 222. Moreover, when a kind of the sound wave called wind noise is generated during the air flows through the fan 212 and the body 214, the sound wave resulting in the wind noise generated by the operating fan 212 is transmitted to the grooves 226. Additionally, the fan system 202 includes a plurality of control circuits 228 respectively embed in the body 214, and each of the control circuits 228 controls the deformation of the body 214 based on the operating state of the fan 212. As a result, the volume of the body 214 and the groove 226 may be changed by this process.

Figure 9B:
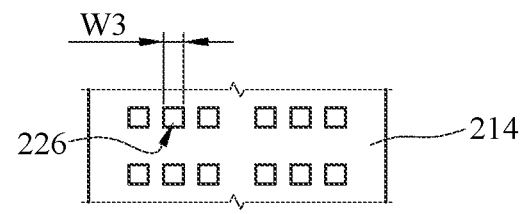
FIG. 9B is the top view of FIG. 9A.

FIG. 9B is the top view from FIG. 9A. As FIG. 9B shows, the grooves 226 arranged between the intervals are disposed in the body 214 in the X-Z plane, and the grooves 226 are in the shapes of squares with the same length for each side.

Figure 10:
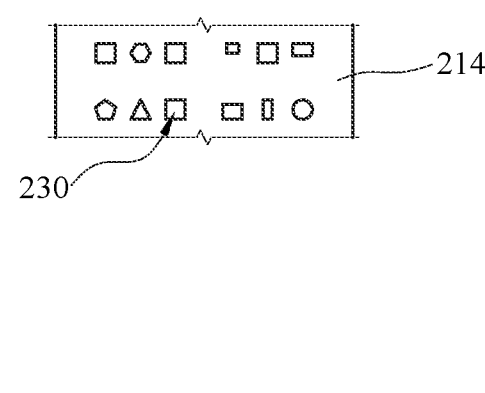
FIG. 10 is the top view of the fan system based on FIG. 8 in the second embodiment.

Please refer to FIG. 10, wherein FIG. 10 is the top view based on the fan system in FIG. 8 in the second embodiment. As FIG. 10 shows, the grooves 230 arranged between the intervals are disposed on the body 214 in the X-Z plane, and the grooves 230 may be in square, rectangle, circle, triangle, pentagon and hexagon shapes.

Figure 11:
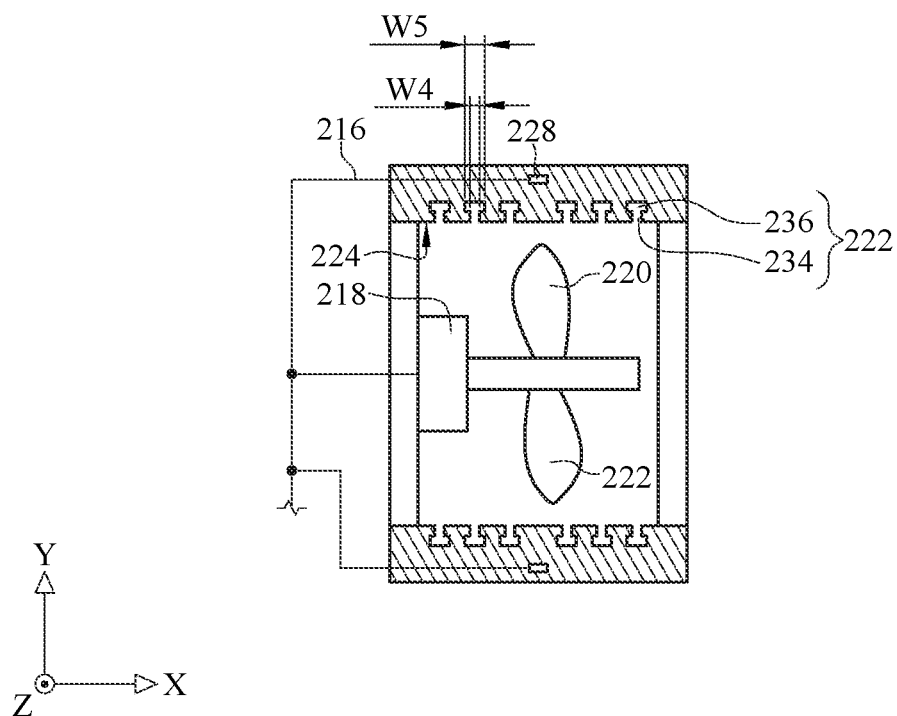
FIG. 11 is the schematic diagram of the fan system based on FIG. 8 in the third embodiment.

Please refer to FIG. 11, wherein FIG. 11 is the schematic diagram of the fan system based on FIG. 8 in the third embodiment. As FIG. 11 shows, the interior face 224 comprises a plurality of the grooves 232 arranged between the intervals, wherein each of the grooves 232 comprises a first section 234 and a second section 236 in the y-axis direction, and the interior face 224 is closer to the first section 234 than to the second section 236. Also, the first section 234 has a width W4 and the second section 236 has a width W5 both in the x-axis direction, and the width W4 is smaller than the width W5. The sound wave with the wind noise is transmitted to the grooves 232 when the fan 212 is operating, and each of the control circuits 228 controls the deformation of the body 214 based on the operating state of the fan 212. As a result, the volume of the groove 232 disposed in the body 214 is able to be changed by this process.

Figure 12:
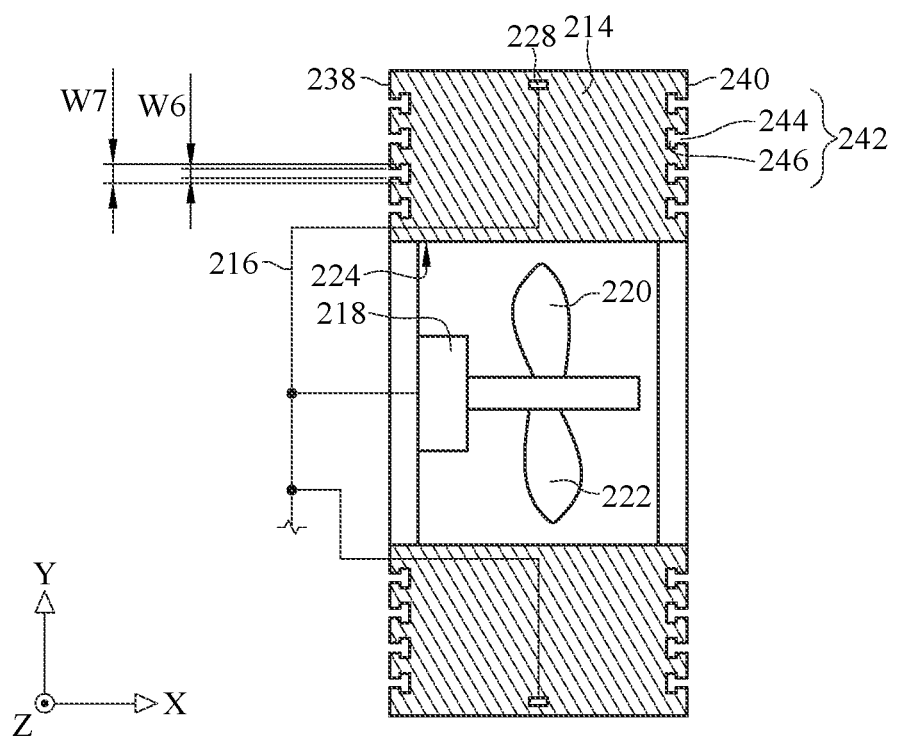
FIG. 12 is the schematic diagram of the fan system based on FIG. 8 in the fourth embodiment.

Please refer to FIG. 12, wherein FIG. 12 is the schematic diagram of the fan system based on FIG. 8 in the fourth embodiment. As FIG. 12 shows, the body 214 of the fan system 202 comprises the interior face 224 and two side faces 238 and 240 which are next to the interior face 224. In addition, the interior face 224 faces the fan 212 and the interior face 224 is spaced from the fan 212, wherein there is a plurality of grooves 242 disposed in each of the two side faces 238 and 240, and the sound wave with the wind noise generated by the operating fan 212 is transmitted to the grooves 242. Also, each of the grooves 242 comprises a first section 244 and a second section 246 in the x-axis direction, and the side face 238 is closer to the first section 244 than to the second section 246. Moreover, the first section 244 has a width W6 and the second section 246 has a width W7 both in the y-axis direction, wherein the width W6 is smaller than the width W7. As a result, each of the control circuits 228 controls the deformation of the body 214 based on the operating state of the fan 212, and the volume of the groove 242 disposed in the body 214 is able to be changed by this process.

Figure 13:
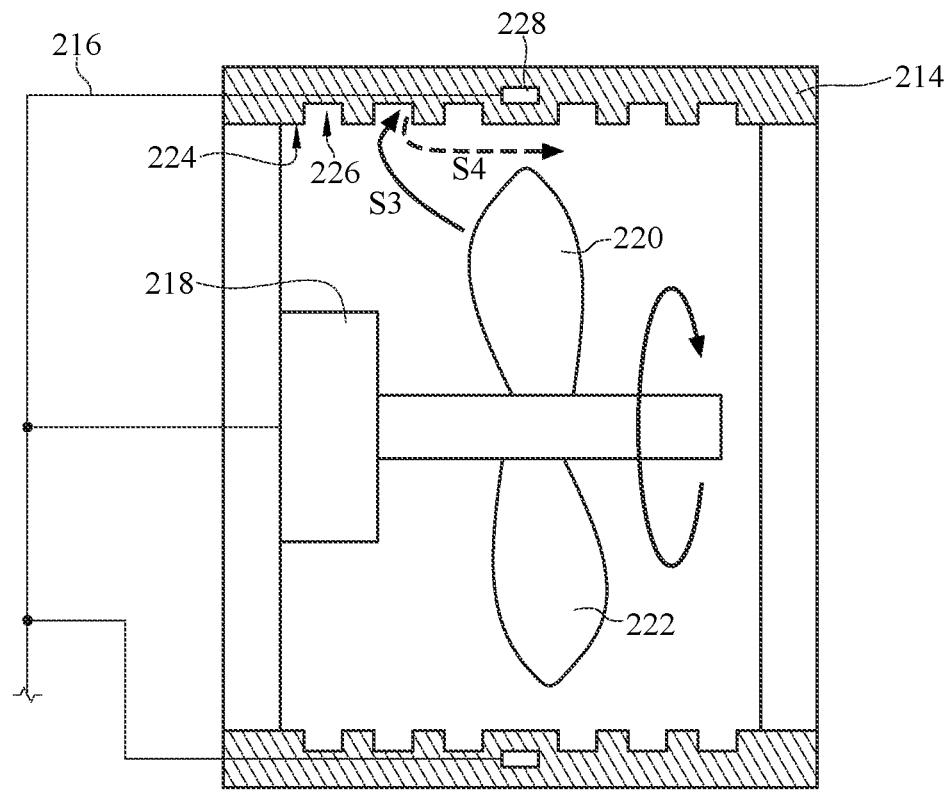
FIG. 13 is the schematic diagram for suppressing the noise of the fan system based on FIG. 9A.

Please refer to FIG. 13, wherein FIG. 13 is the schematic diagram for suppressing the noise of the fan system based on FIG. 9A. When the fan 212 operates at different rotation speeds, the space between the fan 212 and the bottom of the groove 226 needs to be adjusted for suppressing the wind noise. For this reason, after the control circuit 228 adjusts the volume of the groove 226 to a proper value, the inward airflow S3 generated by the operating fan 212 enters the groove 226 of the body 214 and then is reflected therefrom. Finally, the sound volume generated by the outward airflow S4 reflected from the groove 226 is lower than the sound volume generated by the inward airflow S3.

Figure 14:
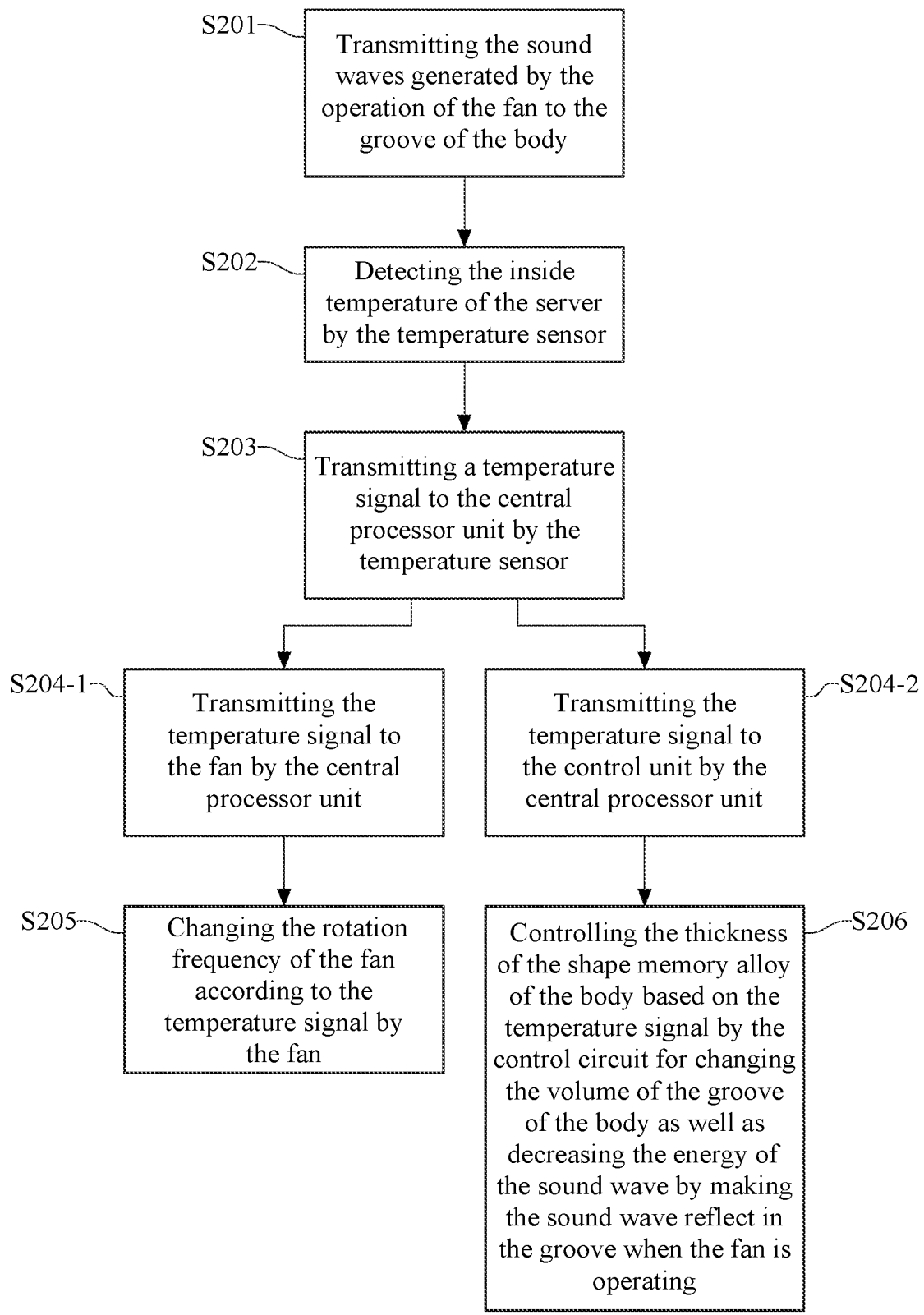
FIG. 14 is the flowchart for the sound suppression method of the fan system based on FIG. 8.

Please refer to FIG. 8 and FIG. 14 together, wherein FIG. 14 is the flowchart for the sound suppression method of the fan system based on FIG. 8. As FIG. 8 and FIG. 14 show, the step S201 is transmitting the sound waves generated by the operation of the fan to the groove 226 of the body 214. The step S202 is detecting the inside temperature of the server 200 by the temperature sensor 208. The step S203 is transmitting a temperature signal to the central processor unit 206 by the temperature sensor 208. The step S204-1 is transmitting the temperature signal to the fan 212 by the central processor unit 206, and the step S204-2 is transmitting the temperature signal to the control circuit 228 by the central processor unit 206. The step S205 is changing the rotation frequency of the fan 212 according to the temperature signal by the fan 212. The step S206 is controlling the thickness of the shape memory alloy of the body 214 based on the temperature signal by the control circuit 228 for changing the volume of the groove 226 of the body as well as decreasing the energy of the sound wave by making the sound wave reflect in the groove 226 when the fan 212 is operating.

When the inside temperature of the server 200 is changed, the rotation speed of the fan 212 is relatively changed, and the fan 112 includes the rotation frequency corresponded to the rotation speed. The fan 212 generates the sound wave with the low frequency when the fan 212 rotates in the low rotation speed, and the fan 212 generates the sound wave with the high frequency when the fan 212 rotates in the high rotation speed. As FIG. 14 shows, as the rotation speed of the fan 212 is increased, the thickness of the shape memory alloy is raised through heating the shape memory alloy of the body 214 by the control circuit 228, and the volume of the groove 226 of the body 214 is decreased. Hence, the space of the groove 226 is smaller than the original space, and the reflection effect of the sound wave in high frequency is improved. If the rotation speed of the fan 212 is decreased as the fan 212 rotates for a time period, the control circuit 228 heats the shape memory alloy of the body 214 until the temperature of the body is more than the critical temperature of the shape memory alloy. Thus, the structure of the shape memory alloy is transformed to the high temperature phase (austenite phase) for returning to the original state. As a result, the volume of the groove 226 is returned to the original volume, and the space of the groove 226 is larger than the original space, so the reflection effect of the sound wave in low frequency is improved.

Based on the fan system disclosed in this disclosure, in addition to maintenance of the normal airflow between the hardware device and the fan system, by the properties of the shape memory alloy and the control circuit, the control circuit is able to change the volume of the groove based on the rotation frequency of the fan and/or the temperature of the electronic device. Hence, even though the fan may operate at different rotation speeds, the resonance frequency of the groove is able to approximate or even equal to the rotation frequency of the fan. As a result, the sound volume generated by the operating fan can be decreased during this process. On the other hand, by changing the thickness of the body appropriately through the control circuit, the space between the fan and the bottom of the groove is able to be maintained in a proper value, and the wind noise is suppressed by this process.

The embodiments depicted above and the appended drawings are exemplary and are not intended to be exhaustive or to limit the scope of the present disclosure to the precise forms disclosed. Many modifications and variations are possible in view of the above teachings.

What is claimed is:

1. A fan system for cooling an electronic device, and the fan system comprising:
   a fan;
   a body surrounding the fan, wherein an interior face of the body faces the fan and is spaced from the fan, the interior face comprises a groove, and the fan transmits a sound wave to the groove, wherein a material of the body is shape memory alloy; and
   a control circuit embedded in the body, wherein the fan and the control circuit are configured to be electrically connected to a circuit board to which a temperature sensor and a central processor unit are electrically connected, and the control circuit is configured to be electrically connected to the central processor unit, the temperature sensor and the fan via the circuit board, a temperature signal detected by the temperature sensor is transmitted to the central processor unit, the central processor unit transmits the temperature sensor to the fan and the control circuit, a rotational speed of the fan is changed according to the temperature signal, and the control circuit controls a deformation of the body based on the temperature signal by heating the body to change a thickness of the body thereby changing a volume of the groove.

2. The fan system according to claim 1, wherein the groove comprises a first width in a first direction.

3. The fan system according to claim 1, wherein the groove comprises a first section and a second section in a first direction, and the interior face is closer to the first section than to the second section, the first section comprises a second width in a second direction and the second section comprises a third width in the second direction, and the second width is smaller than the third width.

4. A fan system for cooling an electronic device, and the fan system comprising:
   a fan;
   a body surrounding the fan, wherein the body comprises an interior face and a side face next to the interior face, wherein the interior face faces the fan and the interior face is spaced from the fan, the side face comprises a groove, the side face does not face the fan and is exposed to outside, and a sound wave is transmitted to the groove when the fan is operating, wherein a material of the body is shape memory alloy; and a control circuit embedded in the body, wherein the fan and the control circuit are configured to be electrically connected to a circuit board to which a temperature sensor r and a central processor unit are electrically connected, and the control circuit is configured to be electrically connected to the central processor unit, the temperature sensor and the fan via the circuit board, a temperature signal detected by the temperature sensor is transmitted to the central processor unit, the central processor unit transmits the temperature sensor to the fan and the control circuit, a rotational speed of the fan is changed according to the temperature signal, and the control circuit controls a deformation of the body based on the temperature signal by heating the body to change a thickness of the body thereby changing a volume of the groove.

5. The fan system according to claim 4, wherein the groove comprises a first section and a second section in a first direction, the side face is closer to the first section than to the second section, and the first section has a first width in a second direction and the second section has a second width in the second direction, and the first width is smaller than the second width.

* * * * *